(12) United States Patent
Tomida et al.

(10) Patent No.: US 12,087,607 B2
(45) Date of Patent: Sep. 10, 2024

(54) ARTICLE TRANSPORT VEHICLE

(71) Applicant: Daifuku Co., Ltd., Osaka (JP)

(72) Inventors: Daichi Tomida, Hinocho (JP); Hiroshi Otsuka, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 307 days.

(21) Appl. No.: 17/560,726

(22) Filed: Dec. 23, 2021

(65) Prior Publication Data

US 2022/0208583 A1 Jun. 30, 2022

(30) Foreign Application Priority Data

Dec. 24, 2020 (JP) .................................. 2020-215637

(51) Int. Cl.
*H01L 21/677* (2006.01)
*B66C 1/28* (2006.01)
*B66C 11/06* (2006.01)
*B66C 19/00* (2006.01)

(52) U.S. Cl.
CPC .......... *H01L 21/67724* (2013.01); *B66C 1/28* (2013.01); *B66C 11/06* (2013.01); *H01L 21/6773* (2013.01); *H01L 21/67733* (2013.01); *B65G 2201/0297* (2013.01); *B66C 19/00* (2013.01)

(58) Field of Classification Search
CPC B66C 11/06; B66C 1/28; B66C 19/00; H01L 21/67724; H01L 21/6773; H01L 21/67733; B65G 2201/0297; B25J 15/0266; B25J 15/0253; B25J 15/0273
USPC .............................................. 294/119.1, 207
See application file for complete search history.

(56) References Cited

U.S. PATENT DOCUMENTS

| 9,576,832 | B2 * | 2/2017 | Tomida | H01L 21/67733 |
| 9,969,551 | B2 * | 5/2018 | Abe | H01L 21/67769 |
| 10,583,568 | B2 * | 3/2020 | Tanahashi | B25J 15/06 |

(Continued)

FOREIGN PATENT DOCUMENTS

| JP | 2009154983 A | 7/2009 |
| JP | 201694263 A | 5/2016 |

OTHER PUBLICATIONS

Jp 2016094263A Machine Translation (Year: 2016).*
Jp 2009154983A Machine Translation (Year: 2009).*

*Primary Examiner* — Michael R Mansen
*Assistant Examiner* — Juan J Campos, Jr.
(74) *Attorney, Agent, or Firm* — The Webb Law Firm

(57) ABSTRACT

An article transport vehicle includes a travel body; a holding device that holds an article; and a lift device that is on the travel body, and that raises and lowers the holding device with respect to the travel body. The holding device includes: a connection portion connected to the lift device and an article support portion that supports the article; an elastic support mechanism that is between the article support portion and the connection portion, and that supports the article support portion against the connection portion while being elastic in a vertical direction, and a guide mechanism that guides the article support portion in the vertical direction with respect to the connection portion. The guide mechanism allows the article support portion to move parallel with the vertical direction with respect to the connection portion and restricts swinging of the article support portion with respect to the connection portion.

8 Claims, 6 Drawing Sheets

(56) References Cited

U.S. PATENT DOCUMENTS

| | | | |
|---|---|---|---|
| 10,640,294 B2* | 5/2020 | Kinugawa | B65G 19/225 |
| 10,643,877 B2* | 5/2020 | Ogo | H01L 21/67706 |
| 11,066,284 B2* | 7/2021 | Tomida | H01L 21/67733 |
| 2016/0133488 A1* | 5/2016 | Tomida | H01L 21/6773 212/71 |

* cited by examiner

ARTICLE TRANSPORT VEHICLE

CROSS-REFERENCE TO RELATED APPLICATION

This application claims priority to Japanese Patent Application No. 2020-215637 filed Dec. 24, 2020, the disclosure of which is hereby incorporated by reference in its entirety.

BACKGROUND OF THE INVENTION

1. Field of the Invention

The present invention relates to an article transport vehicle provided with a traveling body that travels along a travel path, a holding device that holds an article, and a lift device that, with respect to the traveling body, raises and lowers the holding device installed on the traveling body.

2. Description of the Related Art

A known example of this type of article transport vehicle is described in JP 2016-094263 (Patent Document 1). The reference signs in brackets used in the description of the related art are those of Patent Document 1.

An article transport vehicle (1) described in Patent Document 1 is provided with a travel member (16) that travels along a travel rail (2), a support mechanism (23) supported by the travel member (16) that suspends and supports an article (transported article 6), and a vertical movement support portion (17) that supports a support mechanism (23) in a manner allowing it to move vertically. The support mechanism (23) includes a vertically movable portion (31), a guiding supporting portion (35), and a damper element (36) disposed between the vertically movable portion (31) and the guiding supporting portion (35), the damper element (36) being capable of elastically deforming in the vertical direction and receiving a load from the guiding supporting portion (35). With this configuration, the vibrations caused when the travel member (16) travels and the vibrations transmitted to the article (6) when the vertically movable portion (31) moves vertically can be kept to a minimum.

SUMMARY OF THE INVENTION

The article transport vehicle (1) described in Patent Document 1 transfers the article (6) to a support base (4) on the floor. The support mechanism (23) is lowered together with the article (6) when a spooling member (28) is rotationally driven and a spool belt (24a) is fed out. Typically, a positioning mechanism such as a positioning pin for positioning the article (6) is provided on the support base (4), making it necessary that the article (6) is lowered to the support base (4) in the appropriate orientation in order for the article (6) to be appropriately transferred to the support base (4).

However, in the article transport vehicle (1) described in Patent Document 1, the guiding supporting portion (35) is supported on the vertically movable portion (31) via the damper element (36). Thus, in a case where a load is applied to the guiding supporting portion (35) in an unbalanced manner, the guiding supporting portion (35) tilts with respect to the vertically movable portion (31). For example, in a case where the position of the centroid of the article (6) is offset or the like, an off-balance in the amount of deformation of the damper element (36) is caused, causing the guiding supporting portion (35) to tilt with respect to the vertically movable portion (31) and putting the article (6) in an orientation that is tilted with respect to the appropriate orientation. In a case where the article (6) is lowered to the support base (4) in an orientation that is tilted with respect to the appropriate orientation in this manner, the article (6) may be unable to be appropriately transferred to the support base (4). Also, in a case where the elastic modulus of the damper element (36) is increased to restrict the article (6) from taking a tilted orientation, it becomes difficult to appropriately suppress vibrations transmitting to the article (6).

There is a need for an article transport vehicle capable of suppressing vibrations transmitted to the article to a minimum and of appropriately placing the article at a placement section by restricting the article from tilting with respect to an appropriate orientation.

An article transport vehicle according to the present disclosure has a configuration including a travel body that travels along a travel path; a holding device that holds an article; and a lift device that is on the travel body, and that raises and lowers the holding device with respect to the travel body, wherein the holding device includes: a connection portion connected to the lift device and an article support portion that comes into contact with the article and supports the article; the holding device includes an elastic support mechanism between the article support portion and the connection portion that supports the article support portion against the connection portion while being elastic in a vertical direction, and a guide mechanism that guides the article support portion in the vertical direction with respect to the connection portion; and the guide mechanism is configured to allow the article support portion to move parallel with the vertical direction with respect to the connection portion and to restrict swinging of the article support portion with respect to the connection portion.

According to the present configuration, the elastic support mechanism is provided between the article support portion and the connection portion. This allows the elastic support mechanism to dampen the vibrations of the traveling body caused when the traveling body travels and vibrations of the holding device caused when the lift device raises and lowers the holding device. In this manner, vibrations transmitted to the article can be suppressed to a minimum.

Also, according to the present configuration, the guide mechanism can restrict the swinging of the article support portion with respect to the connection portion, and thus the article support portion is restricted from being inclined with respect to the connection portion. Accordingly, even in a case where an unbalanced load acts on the article support portion due to the centroid of the article being offset or the like, the article support portion and the article supported by the article support portion can be restricted from tilting with respect to the connection portion. Thus, in a case where the holding device is lowered by the lift device and the article is placed at the placement section, the article being unable to be appropriately placed due to the orientation of the article being tilted in respect to the appropriate orientation can be avoided. Also, the guide mechanism allows the article support portion to move parallel with the vertical direction with respect to the connection portion. Thus, the effect from the elastic support mechanism of alleviating vibrations in the vertical direction that act on the article support portion and the article supported by the article support portion is not impeded by the guide mechanism.

According to the present configuration, the article transport vehicle is capable of suppressing vibrations transmitted to the article to a minimum and of appropriately placing the article at a placement section by restricting the article from tilting with respect to an appropriate orientation.

DETAILED DESCRIPTION OF PREFERRED EMBODIMENTS

1. Embodiments

An article transport vehicle according to an embodiment of the present invention will be described below with reference to the drawings using an example in which the article transport vehicle is used in an article transport facility.

Figure 1:
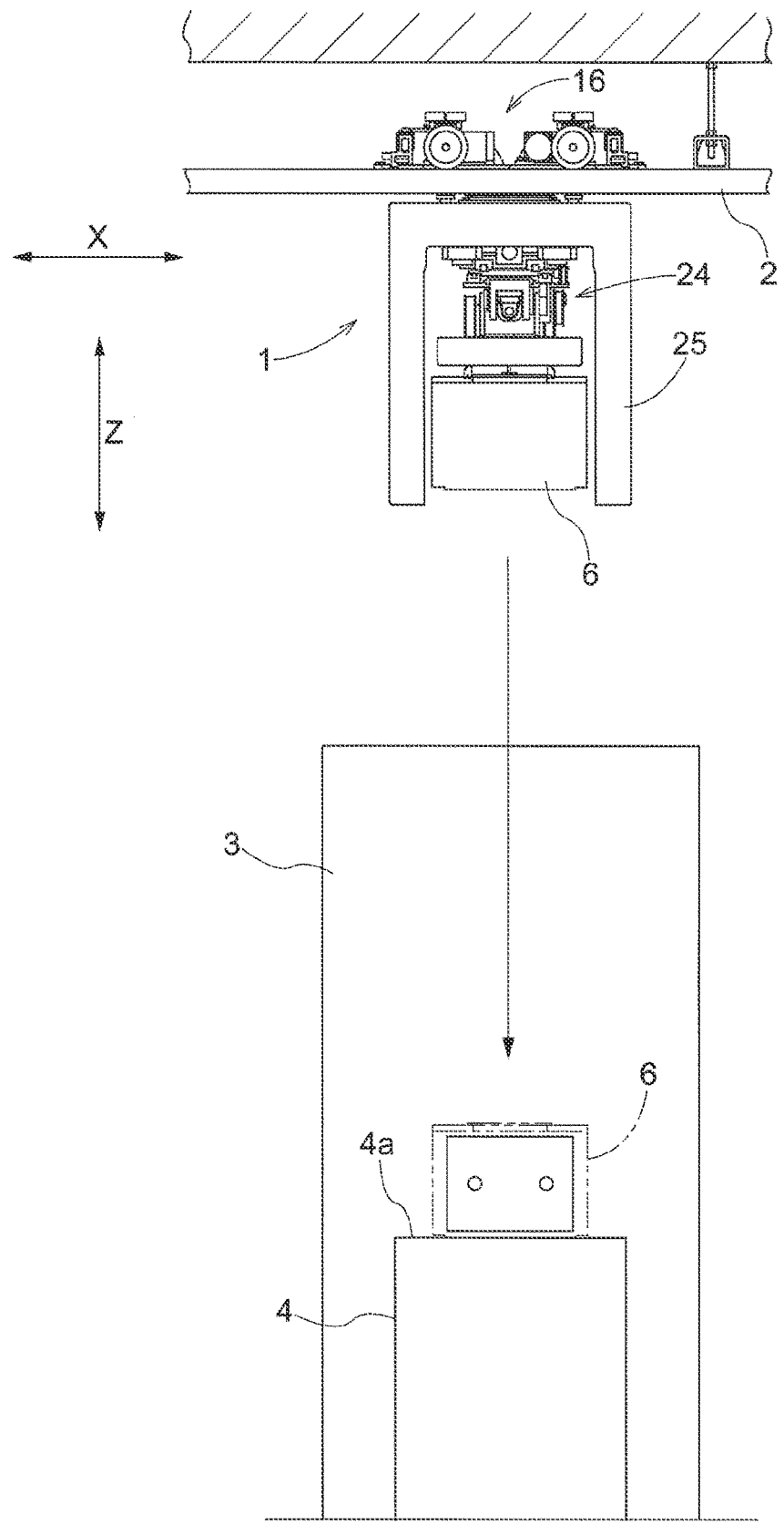
FIG. 1 is a side view of an article transport facility.

As illustrated in FIG. 1, in an article transport facility, an article transport vehicle 1 configured as a ceiling transport vehicle capable of traveling along a travel rail 2 installed on the ceiling, a processing device 3 that processes substrates housed in an article 6, and a placement section 4 such as a support base installed on the floor adjacent to the processing device 3. In this example, the support base is an example of the placement section 4 where the article transport vehicle 1 places the article 6. In this manner, in the present embodiment, the travel path of the article transport vehicle 1 is formed by the travel rail 2. The article 6 transported by the article transport vehicle 1 is a transport container that houses a housed article, with a specific example being a front opening unified pod (FOUP) that houses a plurality of semiconductor substrates, i.e., the housed article.

The placement section 4 such as a support base where the article 6 is placed is installed below the travel path of the article transport vehicle 1. A plurality of the placement sections 4 are installed in a travel direction X of the article transport vehicle 1. The article transport vehicle 1 places the article 6 on the placement section 4 by transporting the article 6 and lowering the article 6 via a lift device 24. Also, the article transport vehicle 1 receives the article 6 from the placement section 4, raises the article 6 via the lift device 24, and transports the article 6 to another transportation destination. In the present embodiment, this kind of passing of an article 6 between the article transport vehicle 1 and the placement section 4 is referred to as transferring, and such an operation is referred to as a transfer operation. In the present embodiment, an engagement protrusion portion P for positioning of the article 6 is provided on a placement surface 4a of the placement section 4 where the article 6 is placed. In the present example, on the placement surface 4a, three engagement protrusion portions P are disposed in a positional relationship with the three engagement protrusion portions P located at the vertices of a triangle. In the present example, after the FOUP, i.e., the article 6 is placed on the support base, i.e., the placement section 4, the semiconductor substrate is removed from the FOUP by the processing device 3, and predetermined processing is executed. Then, the FOUP housing the post-processing semiconductor substrate is received by the article transport vehicle 1 and transported to the transportation destination of another processing device 3 or the like.

Article

Figure 2:
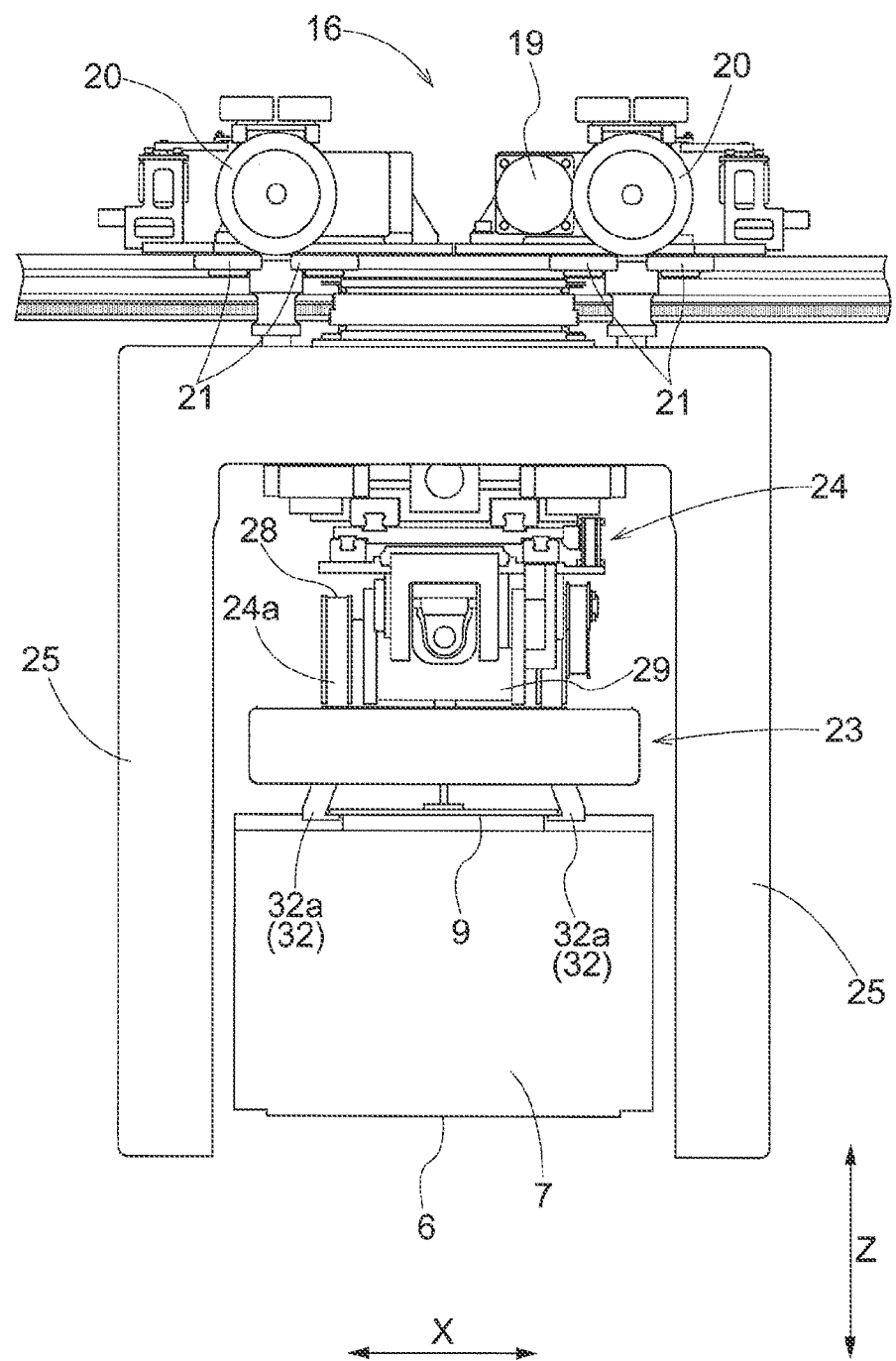
FIG. 2 is a side view of a ceiling transport vehicle.

As illustrated in FIG. 2, the article 6 according to the present embodiment is provided with a body portion 7 that houses the plurality of substrates and a flange portion 9 provided on the upper portion of the article 6 located above the body portion 7.

Also, the article 6 is provided with a cover body 5 (see FIG. 6) that closes the opening for inserting and removing the substrate formed at the front surface of the body portion 7. The cover body 5 is detachably provided on the body portion 7. Note that hereinafter, as seen in a vertical direction along a vertical direction Z, the direction orthogonal with the cover body 5 from the center of the article 6 is defined as an article front-and-back direction, and the direction orthogonal with the article front-and-back direction is defined as an article left-and-right direction.

In the present embodiment, the weight per unit volume of the cover body 5 is greater than the other portions of the article 6 (FOUP). Thus, when the body portion 7 is in an empty state in which a semiconductor substrate is not housed, the centroid of the article 6 is offset to the cover body 5 side in the article front-and-back direction. When a semiconductor substrate is housed in the body portion 7 and the overall weight of the article 6 in increased, the cover body 5 weight proportion of the overall weight is decreased. Accordingly, to move the centroid position closer to the central portion of the article 6, the centroid position is moved in the opposite direction to the cover body 5 side in the article front-and-back direction. Also, the article 6 is configured to be even in weight in the article left-and-right direction. Thus, regardless of whether the article 6 is in an empty state or whether the semiconductor substrate is housed, the centroid of the article 6 is not significantly offset in the article left-and-right direction.

The flange portion 9 and the body portion 7 are connected via an article connection portion 8. The article connection portion 8 is formed projecting upward from the body portion 7. Also, the flange portion 9 is attached to the upper portion of the article connection portion 8 and formed in a plate-like shape projecting from the article connection portion 8 in the article front-and-back direction and the article left-and-right direction. An insertion space 12 is formed between the upper surface of the body portion 7 and the lower surface of the flange portion 9 by a recess in the article front-and-back direction and the article left-and-right direction. By inserting a pair of gripping portions 50 described below into the insertion space 12, the article 6 is gripped by the pair of gripping portions 50.

Figure 6:
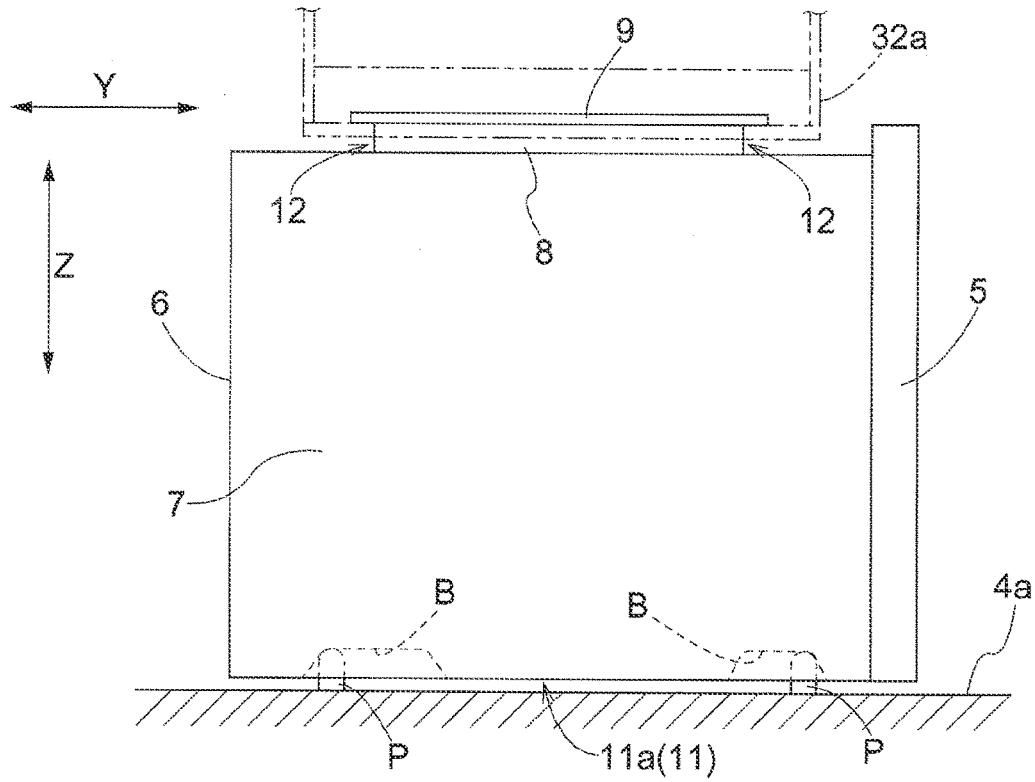
FIG. 6 is a side view of a case where an article is appropriately transferred to the placement section.

As illustrated in FIG. 6, the article 6 is provided with an engagement recess portion B provided in a bottom portion 11. By engaging the engagement recess portion B with the engagement protrusion portion P provided on the placement surface 4a of the placement section 4 described above, the article 6 is positioned with respect to the placement section 4. In the present embodiment, in a bottom surface 11a, the downward facing surface of the bottom portion 11, three engagement recess portions B are disposed in a positional relationship with the three engagement recess portions B located at vertices of a triangle. The positional relationship of the three engagement recess portions B corresponds to the positional relationship of the three engagement protrusion portions P of the placement section 4. Each one of the engagement recess portions B is a groove recessed upward from the bottom surface 11*a*. In the present example, two of the three engagement recess portions B are provided close to the front end portion of the article 6 and separated from one another in the article left-and-right direction. One of the three engagement recess portions B is provided close to the back end portion of the article 6 and at an intermediate portion between the two engagement recess portions B in the left-and-right direction. In the present embodiment, as illustrated in FIG. 6, in a case where the article 6 is lowered by the lift device 24 described below and placed on the placement section 4, the engagement recess portions B engage with the engagement protrusion portions P for positioning provided on the placement section 4.

Article Transport Vehicle

Next, the article transport vehicle 1 will be described. In this example, the direction aligned with the travel direction of the article transport vehicle 1 is defined as the travel direction X, and the direction orthogonal to the travel direction X as seen in the vertical direction is defined as a width direction Y. In the present embodiment, the article 6 is supported in the direction aligned with the travel direction X of the article transport vehicle 1 corresponding to the article left-and-right direction. Thus, hereinafter, using the state in which the article 6 is held by a holding device 23 as a reference, the article left-and-right direction of the article 6 corresponds to the travel direction X, and the article front-and-back direction of the article 6 corresponds to the width direction Y.

As illustrated in FIGS. 1 and 2, the article transport vehicle 1 is provided with a traveling body 16 that travels along a travel path, the holding device 23 that holds the article 6, and the lift device 24 that, with respect to the traveling body 16, raises and lowers the holding device 23 installed on the traveling body 16. Also, the article transport vehicle 1 is further provided with a cover portion 25 that covers the upper side and both sides in the travel direction X of the article 6 supported by the holding device 23 when the holding device 23 is located at or near the upper limit of the vertical movement range of the lift device 24.

As illustrated in FIG. 2, the traveling body 16 is provided with a drive wheel 20 that rolls along the upper surface of the travel rail 2 rotationally driven by a travel motor 19 and a guide wheel 21 capable of rotating while in contact with the side surface of the travel rail 2. Also, the drive wheel 20 is rotationally driven by the travel motor 19, and the guide wheel 21 is guided while in contact with the side surface of the travel rail 2. In this manner, the traveling body 16 travels along the travel path guided by the travel rail 2.

The lift device 24 is provided with a winding body 28 around which a winding belt 24*a* is wound and a lift motor 29 that rotationally drives the winding body 28. The holding device 23 is connected to the leading end portion of the winding belt 24*a*. Also, the lift device 24 raises and lowers the holding device 23 with respect to the traveling body 16 by causing the lift motor 29 to rotationally drive the winding body 28 in the forward direction to feed out the winding belt 24*a* and causing the lift motor 29 to rotationally drive the winding body 28 in the reverse direction to wind up the winding belt 24*a*.

Holding Device

Next, the holding device 23 of the article transport vehicle 1 will be described.

Figure 3:
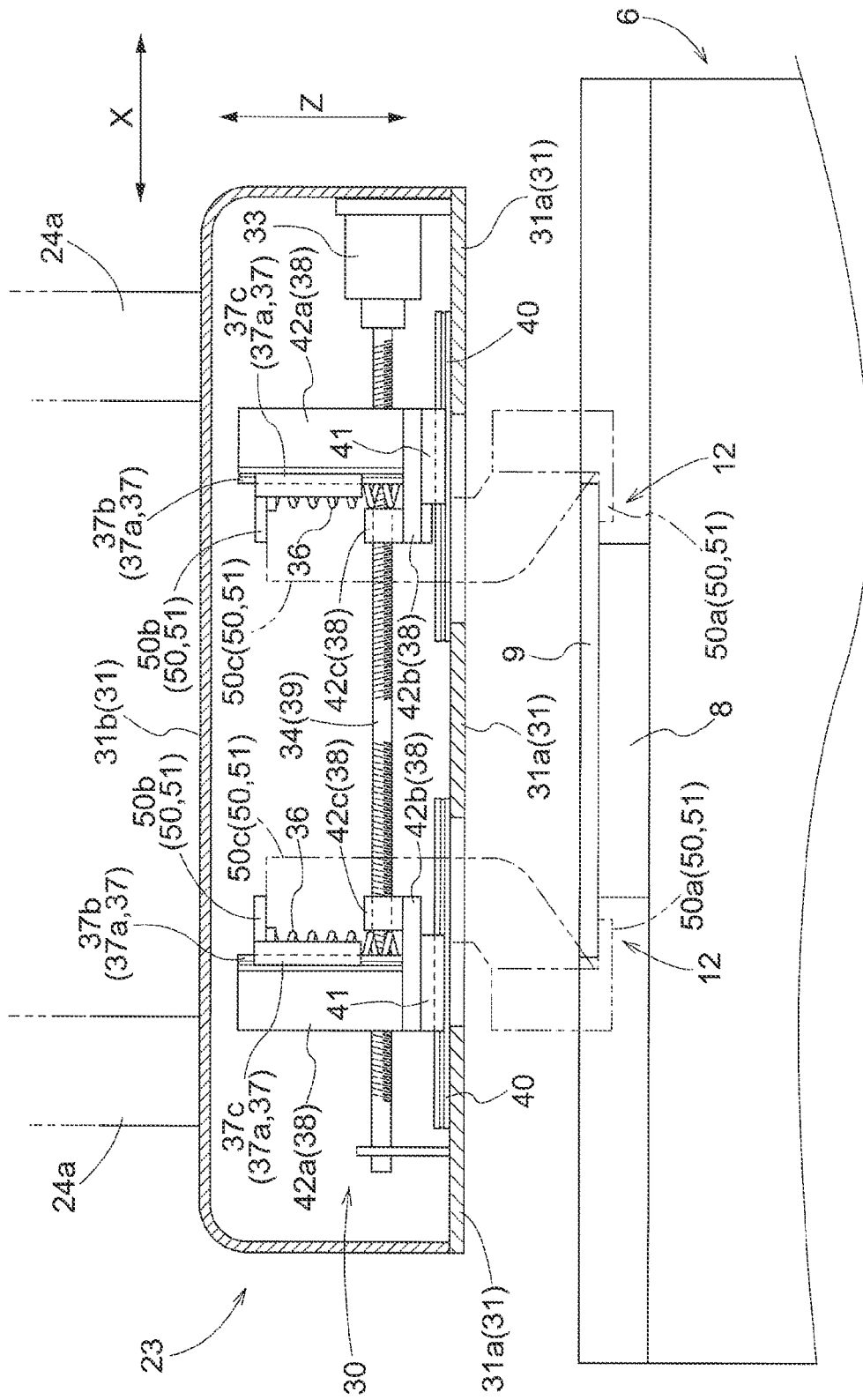
FIG. 3 is a vertical cross section side view of a holding device positioning a pair of transported article support portions at a support position.
Figure 4:
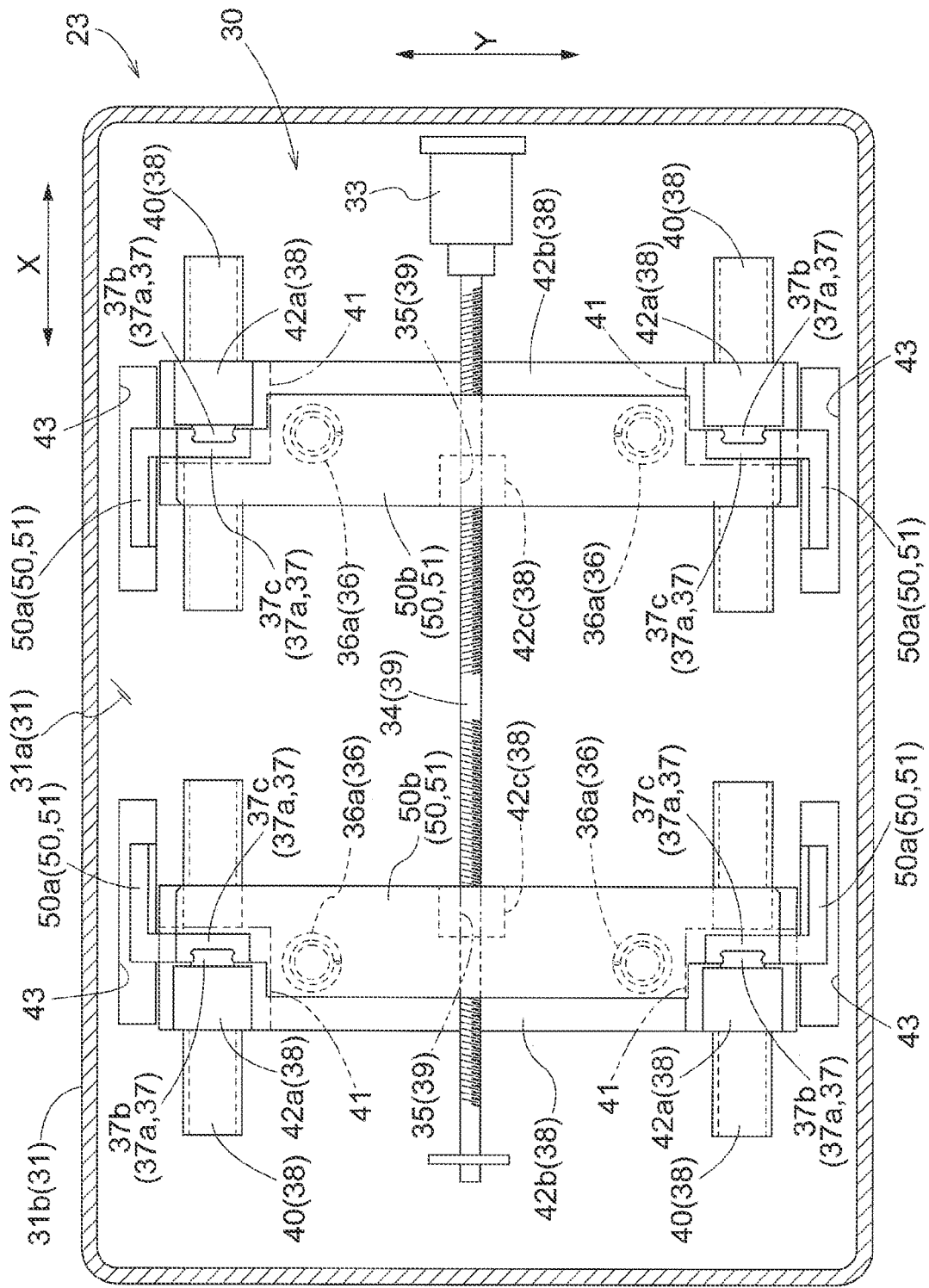
FIG. 4 is a plan view of a holding device.
Figure 5:
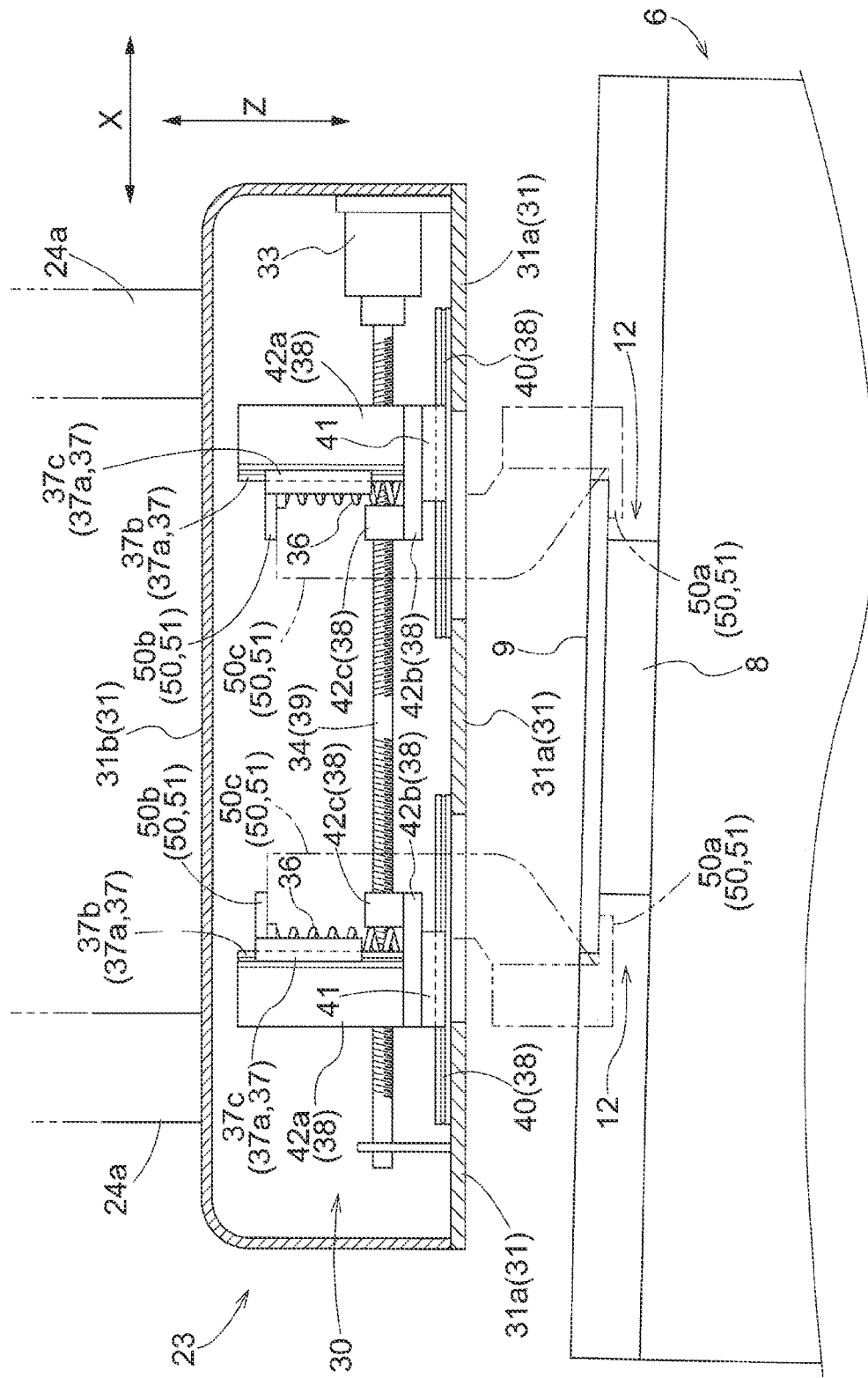
FIG. 5 is a side view of an article support portion tilted in a travel direction with an article transport vehicle in a traveling state.

As illustrated in FIGS. 3 to 5, the holding device 23 of the article transport vehicle 1 is provided with a connection portion 31 connected to the lift device 24 and an article support portion 51 that comes into contact with the article 6 and supports the article 6. In the present embodiment, the connection portion 31 is connected to the leading end portion of the winding belt 24*a*. Thus, the connection portion 31 is raised and lowered by the lift device 24. The connection portion 31 is provided with a support body 31*a* that supports an elastic support mechanism 36 and a guide mechanism 37 described below and a box-like housing 31*b* attached to the support body 31*a* that covers the elastic support mechanism 36 and the guide mechanism 37. Also, in the present embodiment, the holding device 23 is provided with a grip driving mechanism 30 that drives the pair of gripping portions 50 forming the article support portion 51 in the directions toward and away from one another. The grip driving mechanism 30 is also supported by the support body 31*a* and housed inside the housing 31*b*.

The grip driving mechanism 30 will now be described. The grip driving mechanism 30 is provided with a grip guide mechanism 38, a grip drive source 33, and a grip transfer mechanism 39. In the present embodiment, the grip drive source 33 is a grip drive motor constituted by an electric motor.

The grip guide mechanism 38 is a mechanism that guides the movement of the pair of gripping portions 50 in the toward-and-away direction of the gripping portions 50. In the present embodiment, the toward-and-away direction of the pair of gripping portions 50 corresponds to a direction parallel with the travel direction X. Also, in the present example, the grip guide mechanism 38 is provided with a pair of cooperating members 42 that are provided corresponding to the pair of gripping portions 50 and operate in tandem with the movement of the pair of gripping portions 50 in the toward-and-away direction and a guide rail 40 that guides the movement of the pair of cooperating members 42 in the toward-and-away direction. In this example, as illustrated in FIG. 4, a plurality of the guide rails 40 are supported by the support body 31*a* aligned with the travel direction X. In the present embodiment, a pair guide rails 40 for one cooperating member 42 is disposed separated from one another in the width direction Y. Accordingly, in the present embodiment, the grip guide mechanism 38 is provided with four guide rails 40 corresponding to the pair of cooperating members 42. As illustrated in FIGS. 3 and 4, a guided member 41 is attached to a portion of each one of the cooperating members 42 guided by the guide rail 40, the guided member 41 being guided in the travel direction X along the guide rail 40. The guided member 41 engages with the guide rail 40 in a manner allowing it to move along the guide rail 40.

As described above, the cooperating members 42 are provided corresponding to the pair of gripping portions 50. The cooperating members 42 are each configured to connect the grip transfer mechanism 39 and the guide mechanism 37. Also, the cooperating members 42 and the gripping portions 50 are connected via the guide mechanism 37. In the present embodiment, as described below, the guide mechanism 37 corresponding to each one of the pair of gripping portions 50 is provided with a pair of linear guide mechanisms 37*a*. Accordingly, the cooperating members 42 connect the grip transfer mechanism 39 and the pair of linear guide mechanisms 37*a*.

Specifically, the cooperating member 42 is provided with a pair of cooperating fixing portions 42*a* that support the same gripping portion 50 and are fixed to the pair of linear guide mechanisms 37*a*, a cooperating body portion 42*b* connecting the pair of cooperating fixing portions 42*a*, and a cooperating connection portion 42*c* provided on the cooperating body portion 42b and connected to the grip transfer mechanism 39. In the present example, the cooperating body portion 42b is formed in a long plate-like shape long in the width direction Y. The cooperating body portion 42b is fixed to the two guided members 41 disposed separated from one another in the width direction Y. Also, the cooperating body portion 42b is connected to the pair of cooperating fixing portions 42a disposed separated from one another in the width direction Y. In the present example, the cooperating fixing portions 42a are disposed overlapping the guided members 41 as seen in the vertical direction Z. In this manner, the cooperating body portion 42b connects together the pair of guided members 41 and connects together the pair of cooperating fixing portions 42a. The pair of cooperating fixing portions 42a are formed with a greater dimension in the vertical direction Z than the cooperating body portion 42b. Also, each one of the linear guide mechanism 37a is attached to the surface of one of the pair of cooperating fixing portions 42a that faces the direction orthogonal to the vertical direction Z. The cooperating connection portion 42c is a portion connected to the grip transfer mechanism 39 described below. In the present embodiment, a nut portion 35 forming the grip transfer mechanism 39 is attached to the cooperating connection portion 42c. In this example, the cooperating connection portion 42c is provided in a central portion of the cooperating body portion 42b in the width direction Y. Also, in the illustrated example, the cooperating connection portion 42c is formed in a block shape that internally holds the nut portion 35. In the present embodiment, the cooperating connection portion 42c provided on each one of the pair of cooperating members 42 is disposed separated from the other in the travel direction X.

The grip transfer mechanism 39 is a mechanism that transfers the power of the grip drive source 33 to the pair of gripping portions 50 and moves the pair of gripping portions 50 in the direction toward or away from one another. In the present embodiment, the grip transfer mechanism 39 is provided with a ball screw 34 and the nut portions 35 that screw on the ball screw 34.

The ball screw 34 is connected to the grip drive source 33, i.e., the grip drive motor. Also, the ball screw 34 is driven to rotate about an axial center by the grip drive source 33. In the present embodiment, as illustrated in FIG. 4, the ball screw 34 is disposed with its axial center aligned with the travel direction X. Also, in the present example, the ball screw 34 is disposed at a central portion of the support body 31a in the width direction Y. A male thread is formed in the outer circumferential surface of the ball screw 34.

In the present example, the male thread is formed with the spiral orientated in opposite directions on either side of the central portion of the ball screw 34 in the direction (travel direction X) aligned with the axial center. Also, the end portion on one side of the ball screw 34 in the direction (travel direction X) aligned with the axial center is connected to the grip drive source 33. Specifically, one end portion of the ball screw 34 in the axial direction is connected to the output shaft of the grip drive motor.

The nut portion 35 is a cylindrical member with a female thread formed in the inner circumferential surface, the female thread being configured to engage with the male thread formed in the outer circumferential surface of the ball screw 34. Accordingly, the axial center direction of the nut portion 35 is also disposed aligned with the travel direction X in a similar manner to the ball screw 34. In the present embodiment, as described above, the nut portion 35 is attached to the cooperating connection portion 42c of the cooperating member 42. In other words, on each one of the pair of cooperating connection portions 42c disposed separated from one another in the travel direction X, the nut portion 35 is attached. Also, the two nut portions 35 engage with the ball screw 34 at different portions where the male thread is orientated in different directions. Accordingly, in a case where the ball screw 34 rotates in a first direction, the pair of nut portions 35 are brought toward one another, and in a case where the ball screw 34 rotates in a second direction opposite to the first direction, the pair of nut portions 35 are separated from one another. The pair of cooperating members 42 and the pair of gripping portions 50 are brought toward or separated from one another in tandem with the movement of the pair of nut portions 35 being brought toward or separated from one another.

As illustrated in FIG. 4, the article support portion 51 is provided with the pair of gripping portions 50, and the pair of gripping portions 50 are disposed separated from one another in the travel direction X. Also, the article support portion 51 is configured to grip the flange portion 9 of the article 6 via the pair of gripping portions 50. In the present embodiment, each one of the pair of gripping portions 50 is supported by the cooperating member 42 via the elastic support mechanism 36 and the guide mechanism 37 described below. As illustrated in FIG. 3, each one of the pair of gripping portions 50 is provided with a gripping claw portion 50a that corresponds to the portion that comes into contact with the flange portion 9, a supported portion 50b supported by the elastic support mechanism 36 and the guide mechanism 37, and a grip connection portion 50c that connects the gripping claw portion 50a and the supported portion 50b. In the present example, as illustrated in FIG. 6, the gripping claw portion 50a is formed in an elongated plate-like shape extending in the width direction Y. Also, as illustrated in FIGS. 4 and 5, the supported portion 50b is formed extending in the width direction Y. The grip connection portion 50c is provided at the gripping claw portion 50a and at both end portions in the width direction Y of the supported portion 50b and connects the gripping claw portion 50a and the supported portion 50b. In this manner, in the present example, the gripping portion 50 is provided with a pair of the grip connection portion 50c. Note that the pair of gripping portions 50 are disposed symmetrical to one another and have the same configuration.

The gripping claw portion 50a is disposed lower than the connection portion 31. The supported portion 50b is housed inside the connection portion 31. The grip connection portion 50c is disposed projecting downward from the inner portion of the connection portion 31 below the connection portion 31 so that the grip connection portion 50c connects the gripping claw portion 50a and the supported portion 50b. In the present example, as illustrated in FIGS. 3 and 4, the grip connection portion 50c extends in the vertical direction Z through a through hole 43 formed in the support body 31a of the connection portion 31. As described above, each one of the gripping portions 50 is provided with a pair of the grip connection portions 50c. Accordingly, four through holes 43 are formed in the support body 31a separated from one another in the travel direction X and the width direction Y, with one of the grip connection portions 50c being inserted into each one of the through holes 43.

As illustrated in FIGS. 3 and 6, the gripping claw portions 50a of the pair of gripping portions 50 grip the flange portion 9 in a state where the gripping claw portions 50a are disposed in the insertion space 12 formed below the flange portion 9. More specifically, the pair of gripping claw portions 50a is brought into contact with the flange portion 9 from below and supports the flange portion 9 from below.

As described above, each one of the pair of gripping portions 50 is supported by the cooperating member 42 via the elastic support mechanism 36 and the guide mechanism 37 described below. Also, the pair of cooperating members 42 are driven by the grip driving mechanism 30 in the directions toward and away from one another in the travel direction X, causing the pair of gripping portions 50 also to be driven in the directions toward and away from one another. In this manner, the gap between the pair of gripping portions 50 changes between a grip gap and a release gap. The grip gap is the gap when the pair of gripping portions 50 have been brought toward one another. In the grip gap state, the gap in the travel direction X between the pair of gripping claw portions 50a is narrower than the width of the flange portion 9 in the travel direction X. The release gap is the gap when the pair of gripping portions 50 have been separated from one another. In the release gap state, the gap in the travel direction X between the pair of gripping claw portions 50a is wider than the width of the flange portion 9 in the travel direction X.

Accordingly, when the gap between the pair of gripping portions 50 changes from the release gap to the grip gap, the flange portion 9 is gripped, allowing the article 6 to be held by the holding device 23. Also, when the gap between the pair of gripping portions 50 changes from the grip gap to the release gap, the grip on the flange portion 9 is released, allowing the hold on the article 6 by the holding device 23 to be released.

As illustrated in FIGS. 3 to 5, the holding device 23 is provided with the elastic support mechanism 36 disposed between the article support portion 51 and the connection portion 31, the elastic support mechanism 36 supporting the article support portion 51 against the connection portion 31 in a state with elasticity in the vertical direction Z. As described above, in the present embodiment, the article support portion 51 is provided with the pair of gripping portions 50. Thus, the elastic support mechanism 36 is configured to elastically support each one of the pair of gripping portions 50 against the connection portion 31. Also as described above, the pair of gripping portions 50 are configured to be guided by the grip guide mechanism 38 in movement in the toward-and-away direction (the travel direction X here). Thus, each one of the gripping portions 50 is supported by the cooperating members 42 forming the grip guide mechanism 38 via the elastic support mechanism 36 and the guide mechanism 37. Accordingly, in the present embodiment, the elastic support mechanism 36 is configured to support the gripping portions 50 against the cooperating members 42 in a state with elasticity in the vertical direction Z. More specifically, the elastic support mechanism 36 is provided between the cooperating body portion 42b and the supported portion 50b of the gripping portion 50 in the vertical direction Z. In the illustrated example, the supported portion 50b is disposed higher than the cooperating body portion 42b. Accordingly, the elastic support mechanism 36 elastically supports the supported portion 50b from below. In the present example, the elastic support mechanism 36 is provided with an elastic body 36a with elasticity in the vertical direction Z. The elastic body 36a is a compression coil spring in the illustrated example. The lower end portion of the elastic body 36a is held by the cooperating body portion 42b, and the upper end portion of the elastic body 36a is held by the supported portion 50b. In other words, the cooperating body portion 42b and the supported portion 50b are provided with a holding portion that each hold the elastic body 36a. Also, the elastic body 36a is disposed sandwiched between the cooperating body portion 42b and the supported portion 50b in a compressed state.

In the present embodiment, the elastic support mechanism 36 is provided with a pair of the elastic bodies 36a separated from one another in the width direction Y for each one of the pair of gripping portions 50. As illustrated in FIG. 4, the pair of elastic bodies 36a of one gripping portion 50 are disposed separated in the width direction Y. Also, in the present embodiment, in each one of the pair of gripping portions 50, the pair of elastic bodies 36a are disposed inward in the width direction Y from the pair of guide rails 40.

Furthermore, in the present embodiment, the elastic support mechanism 36 supports the pair of gripping portions 50 so that the pair of gripping portions 50 is movable vertically independent on one another. As described above, the elastic support mechanism 36 is provided corresponding to each one of the pair of gripping portions 50 and is configured to elastically support each one of the pair of gripping portions 50 against the connection portion 31. Accordingly, one of the pair of gripping portions 50 is supported by one of the pair of elastic support mechanisms 36 against the connection portion 31 in a state with elasticity in the vertical direction Z, and the other one of the pair of gripping portions 50 is supported by the other one of the pair of elastic support mechanisms 36 against the connection portion 31 in a state with elasticity in the vertical direction Z. In this manner, the pair of gripping portions 50 are supported by the elastic support mechanisms 36 in a manner allowing the gripping portions 50 to move vertically independent of one another.

As illustrated in FIGS. 3 and 4, the holding device 23 is provided with the guide mechanism 37 that guides the movement of the article support portion 51 in the vertical direction Z with respect to the connection portion 31. The guide mechanism 37 is configured to allow the article support portion 51 to move parallel with the vertical direction Z with respect to the connection portion 31 and to restrict the swinging of the article support portion 51 with respect to the connection portion 31. As described above, in the present embodiment, the article support portion 51 is provided with the pair of gripping portions 50. The guide mechanism 37 is configured to allow the pair of gripping portions 50 to move parallel with the vertical direction Z with respect to the connection portion 31. Also, the guide mechanism 37 is configured to restrict the swinging of each one of the pair of gripping portions 50 in the width direction Y and the travel direction X with respect to the connection portion 31. Thus, in the present embodiment, the guide mechanism 37 connects the gripping portions 50 and the cooperating members 42 in a state in which the pair of gripping portions 50 are able to move parallel with the vertical direction Z with respect to the corresponding cooperating members 42.

"Move parallel" used herein means the article support portion 51 (in the present embodiment, the pair of gripping portions 50) moving with respect to the connection portion 31 with a first reference axis and a second reference axis being kept in a parallel state, where a reference orientation is the orientation when the article support portion 51 is not supporting the article 6 and the holding device 23 is in an ideal positional relationship with the horizontal plane, the first reference axis is an imaginary axis corresponding to the reference of the connection portion 31 when the connection portion 31 is parallel with the vertical direction Z in the reference orientation state, and the second reference axis is an imaginary axis corresponding to the reference of the article support portion 51 when the article support portion 51 is parallel with the vertical direction Z in the reference orientation state. Also, "swing" means the article support portion 51 (in the present embodiment, the pair of gripping portions 50) moving with respect to the connection portion 31 so that the second reference axis is inclined with respect to the first reference axis. The guide mechanism 37 is configured to restrict the swinging of the article support portion 51 with respect to the connection portion 31, and thus the article support portion 51 is restricted from being inclined with respect to the connection portion 31.

In the present embodiment, as illustrated in FIGS. 3 and 4, the guide mechanism 37 is configured to guide the movement of the pair of gripping portions 50 in the vertical direction Z with respect to the connection portion 31. In this example, the guide mechanism 37 is configured to guide the pair of gripping portions 50 so that the gripping portions 50 move vertically independent of one another. To perform this guidance, the guide mechanism 37 is provided with the linear guide mechanisms 37a. In the present embodiment, the guide mechanism 37 is provided with the linear guide mechanisms 37a disposed at a plurality of sections, the linear guide mechanisms 37a being separated from one another in the direction aligned with the horizontal plane. Specifically, as illustrated in FIGS. 3 to 5, the guide mechanism 37 is provided with four linear guide mechanisms 37a in total. Each one of the linear guide mechanisms 37a is provided with a guiding body 37b fixed to the connection portion 31 and a moving body 37c that is fixed to the article support portion 51 and moves along the guiding body 37b. Also, the guiding body 37b is disposed in a manner allowing the moving body 37c to move in the vertical direction Z. In other words, the guiding body 37b is disposed aligned with the vertical direction Z. The guiding body 37b is a member that guides the movement of the moving body 37c in a straight line and, in the present example, is formed in a rail-like shape. The moving body 37c engages with the guiding body 37b in a manner allowing the moving body 37c to move along the guiding body 37b in a straight line. Note that in the present example, the linear guide mechanisms 37a is a linear guide.

In the present embodiment, the guiding body 37b is fixed to the cooperating member 42. Also, the moving body 37c is fixed to the gripping portion 50. As described above, by the moving bodies 37c being guided and moved along the guiding bodies 37b in the vertical direction Z, the gripping portions 50 are guided and moved in the vertical direction Z with respect to the cooperating members 42. In other words, movement parallel with the vertical direction Z of the gripping portions 50 with respect to the cooperating members 42 is allowed. Also, because the moving bodies 37c guided by the guiding bodies 37b cannot move in any direction except the vertical direction Z, swinging of the gripping portions 50 in the width direction Y and the travel direction X with respect to the cooperating members 42 is restricted.

Also, in the present embodiment, the guide mechanism 37 is provided with the pair of linear guide mechanisms 37a disposed separated from one another in the width direction Y for each one of the pair of gripping portions 50. As illustrated in FIG. 4, the pair of linear guide mechanisms 37a of one gripping portion 50 are disposed separated in the width direction Y. In the present example, the pair of linear guide mechanisms 37a are attached to the pair of cooperating fixing portions 42a provided on the end portions of the cooperating body portion 42b in the width direction Y. More specifically, the guiding body 37b of each one of the pair of linear guide mechanisms 37a is fixed to the cooperating fixing portion 42a. In this manner, the pair of linear guide mechanisms 37a are connected via the cooperating member 42. Also, the pair of linear guide mechanisms 37a are disposed at positions overlapping the cooperating body portion 42b and the guided member 41 as seen in the vertical direction Z. Furthermore, in the present embodiment, the pair of linear guide mechanisms 37a are attached to the supported portion 50b of the gripping portion 50. More specifically, the moving body 37c of each one of the pair of linear guide mechanisms 37a is fixed to the supported portion 50b. Thus, the gripping portions 50 are guided by the pair of linear guide mechanisms 37a to move parallel with the vertical direction Z with respect to the cooperating members 42.

The pair of gripping portions 50 are independent of one another. In other words, as illustrated in FIGS. 3 to 5, each one of the pair of gripping portions 50 is supported by a different elastic support mechanism 36 and guided by a different guide mechanism 37. In this manner, the pair of gripping portions 50 are allowed to move in the vertical direction Z with respect to the connection portion 31 independently of one another. Thus, as illustrated in FIG. 5 for example, the position of the pair of gripping portions 50 in the vertical direction Z may different from one another.

In this manner, the pair of gripping portions 50 are disposed separated from one another in the travel direction X and capable of moving vertically independent of one another. Thus, even though the guide mechanism 37 is provided as described above, the article 6 is allowed to swing in the travel direction X. Typically, when the article 6 is transported by the article transport vehicle 1, it is common for a load in the travel direction X to act on the article 6 due to the acceleration/deceleration of the article transport vehicle 1. However, according to the configuration of the present embodiment, the pair of gripping portions 50 move vertically independent of one another. Thus, the effect from the elastic support mechanism 36 of alleviating vibrations in the direction the article 6 swings in the travel direction X is not impeded by the guide mechanism 37. Also, with the configuration for the present embodiment, the guide mechanism 37 is configured to guide the movement of each one of the pair of gripping portions 50 in the vertical direction Z related to the connection portion 31 and is configured to restrict the swinging of the pair of gripping portions 50 with respect to the connection portion 31, in particular the swinging in the width direction Y. Accordingly, even in a case where a load unbalanced in the width direction Y acts on the pair of gripping portions 50 due to the centroid of the article 6 being offset in the width direction Y, for example, the pair of gripping portions 50 tilting in the width direction Y with respect to the connection portion 31 can be restricted. Thus, the article 6 supported by the pair of gripping portions 50 tilting in the width direction Y with respect to the connection portion 31 can be restricted. In the present embodiment, the article 6 is a FOUP that houses a plurality of semiconductor substrates, and the article 6 is transported by the article transport vehicle 1 with the cover body 5 (see FIG. 6) disposed on one side of the article 6 in the width direction Y. In a FOUP, because the weight per unit volume of the cover body 5 is greater than that in other portions and a plurality of semiconductor substrates are housed inside, the centroid position of the entire article 6 in the width direction Y changes. However, according to the configuration of the present embodiment, the article 6 tilting in the width direction Y due to such a change in the centroid can be restricted.

Also, as illustrated in FIG. 4, in the present embodiment, in each one of the pair of gripping portions 50, the pair of linear guide mechanisms 37a are disposed further outward in the width direction Y than the pair of elastic bodies 36a.

Here, the load that acts on the gripping portions 50 due to the article 6 swinging in the width direction Y typically is greater on the outer side in the width direction Y than on the inner side in the width direction Y. Accordingly, disposing the pair of linear guide mechanisms 37a further outward in the width direction Y than the pair of elastic bodies 36a, as opposed to disposing the pair of linear guide mechanisms 37a further inward in the width direction Y than the pair of elastic bodies 36a, allows the load that acts on the linear guide mechanisms 37a to be reduced. Note that in this case, a relatively large load acts on the pair of elastic bodies 36a. However, typically, the elastic bodies 36a are simpler in structure than the linear guide mechanisms 37a and enable a higher strength to be secured, thus making a significant problem unlikely to occur.

Transfer Operation of Article

Next, the operation in a case where the article 6 held by the holding device 23 is lowered by the lift device 24 and transferred to the placement section 4 directly below will be described.

In this example, the position of the holding device 23 with respect to the traveling body 16 when the article 6 is housed in the cover portion 25 is defined as a travel position (see FIG. 2). The lift device 24 feeds out the winding belt 24a via the rotational drive from the lift motor 29 and lowers the holding device 23 from the travel position to a transfer position (see FIG. 6). By lowering the holding device 23 to the transfer position, the article 6 held by the holding device 23 is placed on the placement section 4. In this manner, the transfer position is a position lower than the travel position and is the position of the holding device 23 with respect to the traveling body 16 when the article 6 held by the holding device 23 is placed on the placement surface 4a of the placement section 4. In a state in which the holding device 23 is at the transfer position and the article 6 is placed on the placement surface 4a, via the grip driving mechanism 30, the gap between the pair of gripping portions 50 is switched from the grip gap for gripping the article 6 to the release gap for releasing the grip on the article 6. In this manner, the article 6 is transferred to the placement section 4. As described above, in the present example, a plurality of engagement protrusion portions P for positioning are provided on the placement surface 4a of the placement section 4. Also, engagement recess portions B that engage with the engagement protrusion portions P are provided in the bottom surface 11a of the article 6. Also, in a case where the holding device 23 lowers to the transfer position with the article 6 in the appropriate orientation, the article 6 is placed appropriately on the placement surface 4a of the placement section 4 with the engagement recess portions B of the article 6 engaged with the engagement protrusion portions P of the placement section 4. Hereinafter, the orientation of the article 6 which allows the engagement recess portions B of the article 6 to appropriately engage with the engagement protrusion portions P of the placement section 4 in a case where the holding device 23 is lowered to the transfer position is defined as the appropriate orientation. In the present embodiment, the placement surface 4a of the placement section 4 is disposed aligned with the horizontal plane, and the bottom surface 11a of the article 6 has an orientation aligned with the horizontal plane when the orientation of the article 6 is in the appropriate orientation.

A transfer operation according to a comparative example in a case where the holding device 23 is not provided with the linear guide mechanisms 37a will now be described. In this case, the swinging of the pair of gripping portions 50 with respect to the connection portion 31 is not restricted.

Figure 7:
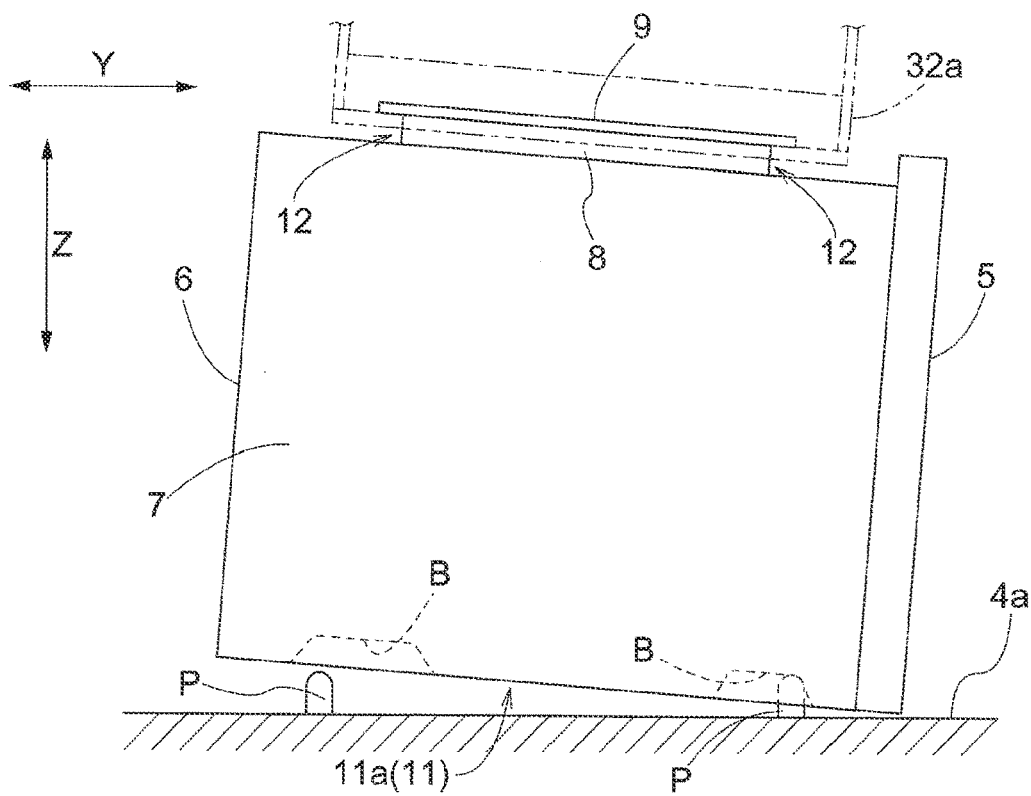
FIG. 7 is a side view of a case where the article is transferred to the placement section in a tilted state.

Thus, in a case where the centroid of the article 6 is offset in the width direction Y, an unbalanced load acts on the pair of gripping portions 50, and the pair of gripping portions 50 and the article 6 gripped thereby are tilted in the width direction Y with respect to the connection portion 31. For example, as in the present embodiment, in a case where the article 6 is a FOUP housing a plurality of semiconductor substrates and the cover body 5 (see FIG. 7) is disposed on one side of the article 6 in the width direction Y, because the weight per unit volume of the cover body 5 is greater than that in other portions and a plurality of semiconductor substrates are housed inside, the centroid position of the entire article 6 in the width direction Y changes. Specifically, the lower the number of semiconductor substrates, the more the centroid of the article 6 is offset to the cover body 5 side in the width direction Y. As in the comparative example, in a case where the holding device 23 is not provided with the linear guide mechanisms 37a, the pair of gripping portions 50 are elastically supported by the elastic support mechanisms 36. Thus, when the centroid of the article 6 is offset, the article 6 and the pair of gripping portions 50 tilting to the side the centroid is offset toward cannot be restricted, and the article 6 tilts in the width direction Y with respect to the appropriate orientation. In a case where the holding device 23 is lowered to the transfer position with the article 6 is a tilted state with respect to the appropriate orientation, for example, as illustrated in FIG. 7, the bottom surface 11a of the article 6 takes a tilted orientation with respect to the placement surface 4a. This may cause the engagement recess portions B of the article 6 and the engagement protrusion portions P of the placement section 4 to be unable to appropriately engage. In such cases, the article 6 is not appropriately placed at the placement section 4 and a transfer failure may occur.

However, in a case where the holding device 23 is provided with the linear guide mechanisms 37a as in the present embodiment, the pair of gripping portions 50 functioning as the article support portion 51 is allowed to move parallel with the vertical direction Z with respect to the connection portion 31 but is restricted from swinging with respect to the connection portion 31. Thus, each one of the pair of gripping portions 50 is elastically supported by the elastic support mechanism 36 with the gripping portion 50 being only allowed to move parallel with the vertical direction Z. Also, as described above, each one of the pair of gripping portions 50 is formed extending in the width direction Y and supports the flange portion 9 of the article 6 in an orientation aligned with the width direction Y. Accordingly, the article 6 is restricted from swinging in the width direction Y with respect to the pair of gripping portions 50. In this manner, even in a case where an unbalanced load acts on the pair of gripping portions 50 due to the centroid of the article 6 being offset in the width direction Y as described above, the orientation of each one of the pair of gripping portions 50 is maintained with respect to the connection portion 31, and the article 6 is restricted from tilting with respect to the connection portion 31. Accordingly, in a case where the lift device 24 lowers the holding device 23 to the transfer position and the article 6 is placed at the placement section 4, the orientation of the article 6 can be restricted from being tilted with respect to the appropriate orientation. Because the holding device 23 is lowered to the transfer position with the article 6 being maintained in the appropriate orientation in this manner, as illustrated in FIG. 6, the engagement recess portions B provided in the bottom surface 11a of the article 6 and the engagement protrusion portions P provided on the placement surface 4a of the placement section 4 can appropriately engage. In other words, regardless of whether the centroid of the article 6 is offset in the width direction Y, the article 6 can be appropriately placed at the placement section 4.

2. Other Embodiments

Next, an article transport vehicle according to other embodiments will be described.

1. In the embodiment described above, the elastic bodies 36a forming the elastic support mechanism 36 provided between the article support portion 51 and the connection portion 31 are compression coil springs. However, the configuration of the elastic body 36a is not limited thereto. By changing where the elastic body 36a is disposed in the elastic support mechanism 36, a tension coil spring or another type of spring may be used. Also, for example, a synthetic rubber, synthetic resin, or the like with elasticity may be used.

2. In the embodiment described above, the article support portion 51 is provided with the pair of gripping portions 50, and the pair of gripping portions 50 are disposed separated from one another in the travel direction X. However, the configuration of the article support portion 51 is not limited thereto. For example, the pair of gripping portions 50 may be disposed separated from one another in the width direction Y. Such a configuration is suited to a case where the position of the centroid of the article 6 is offset in the travel direction X and a case where the load acts in the width direction Y on the article 6 during transportation. Also, for example, the article support portion 51 may be provided with a fork that is inserted into the insertion space 12 of the flange portion 9 instead of the pair of gripping portions 50. Alternatively, the article support portion 51 may be provided with a placement portion that supports the article 6 placed on the placement surface instead of the pair of gripping portions 50. In this case of this configuration, the entire integrally formed article support portion 51 is elastically supported by the elastic support mechanism 36 and guided by the guide mechanism 37 with movement parallel with the vertical direction Z with respect to the connection portion 31 being allowed and swinging (swinging in both the travel direction X and the width direction Y) with respect to the connection portion 31 being restricted.

3. In the embodiment described above, the pair of linear guide mechanisms 37a are disposed further outward in the width direction Y than the pair of elastic bodies 36a. However, this configuration is not limited to that described in the present disclosure, and, for example, the pair of linear guide mechanisms 37a may be disposed further inward in the width direction Y than the pair of elastic bodies 36a.

4. In the embodiment described above, the pair of guiding bodies 37b are fixed to the cooperating fixing portions 42a, and the pair of moving bodies 37c are fixed to the supported portions 50b. However, this configuration is not limited to that described in the present disclosure, and, for example, the pair of guiding bodies 37b may be fixed to the supported portions 50b and the pair of moving bodies 37c may be fixed to the cooperating fixing portions 42a.

5. In the embodiment described above, as the linear guide mechanisms 37a forming the guide mechanism 37, linear guides are used. However, the configuration of the linear guide mechanisms 37a is not limited thereto. For example, a ball spline, a linear bushing, or various known linear guide mechanisms can be used.

6. In the embodiment described above, as illustrated in FIG. 4, the guide mechanism 37 is provided with a total of four linear guide mechanisms 37a, two linear guide mechanisms 37a for each one of the pair of gripping portions 50.

However, the configuration of the guide mechanism 37 is not limited thereto. For example, three or more linear guide mechanisms 37a may be provided for each gripping portion 50. Also, for each gripping portion 50, only one linear guide mechanism 37a may be provided. Furthermore, in a case where the article support portion 51 is integrally formed, one or a plurality of linear guide mechanisms 37a may be provided for the integrally formed article support portion 51.

7. In the embodiment described above, the article 6 is provided with the flange portion 9 and the engagement recess portions B, and the engagement protrusion portions P that engage with the engagement recess portions B are provided on the placement section 4. However, this configuration is not limited to that described in the present disclosure, and, for example, the article 6 may not be provided with the engagement recess portions B and the engagement protrusion portions P may not be provided on the placement section 4. Even in such a configuration, according to the configuration of the embodiment described above, because the article 6 is restricted from being placed in a tilted orientation with respect to the placement surface 4a of the placement section 4, the article 6 can be appropriately placed at the placement section 4.

8. Note that the configurations described in the embodiments described above can be used in combination with configurations described in other embodiments as long as inconsistencies are avoided. Also, regarding the other configurations, the embodiments described in the present specification are merely examples in all aspects. Accordingly, various modifications within the range of the present disclosure can be made as appropriate.

3. Supplement

A summary of the article transport vehicle described above will be described simply below.

An article transport vehicle includes a travel body that travels along a travel path; a holding device that holds an article; and a lift device that is on the travel body, and that raises and lowers the holding device with respect to the travel body, wherein the holding device includes a connection portion connected to the lift device and an article support portion that comes into contact with the article and supports the article; the holding device includes: an elastic support mechanism between the article support portion and the connection portion that supports the article support portion against the connection portion while being elastic in a vertical direction, and a guide mechanism that guides the article support portion in the vertical direction with respect to the connection portion; and the guide mechanism is configured to allow the article support portion to move parallel with the vertical direction with respect to the connection portion and to restrict swinging of the article support portion with respect to the connection portion.

According to the present configuration, the elastic support mechanism is provided between the article support portion and the connection portion. This allows the elastic support mechanism to dampen the vibrations of the traveling body caused when the traveling body travels and vibrations of the holding device caused when the lift device raises and lowers the holding device. In this manner, vibrations transmitted to the article can be suppressed to a minimum.

Also, according to the present configuration, the guide mechanism can restrict the swinging of the article support portion with respect to the connection portion, and thus the article support portion is restricted from being inclined with respect to the connection portion. Accordingly, even in a case where an unbalanced load acts on the article support portion due to the centroid of the article being offset or the like, the article support portion and the article supported by the article support portion can be restricted from tilting with respect to the connection portion. Thus, in a case where the holding device is lowered by the lift device and the article is placed at the placement section, the article being unable to be appropriately placed due to the orientation of the article being tilted in respect to the appropriate orientation can be avoided. Also, the guide mechanism allows the article support portion to move parallel with the vertical direction with respect to the connection portion. Thus, the effect from the elastic support mechanism of alleviating vibrations in the vertical direction that act on the article support portion and the article supported by the article support portion is not impeded by the guide mechanism.

According to the present configuration, the article transport vehicle is capable of suppressing vibrations transmitted to the article to a minimum and of appropriately placing the article at a placement section by restricting the article from tilting with respect to an appropriate orientation.

Here, preferably, the article support portion includes a pair of gripping portions, the pair of gripping portions are separate from each other in a travel direction along the travel path, the elastic support mechanism supports the pair of gripping portions in such a manner that the pair of gripping portions are movable vertically and independent of each other, and the guide mechanism is configured to guide each of the pair of gripping portions in the vertical direction with respect to the connection portion.

Typically, when the article is transported by the article transport vehicle, it is common for a load in the travel direction to act on the article due to the acceleration/deceleration of the article transport vehicle. According to the present configuration, the pair of gripping portions are disposed separated from one another in the travel direction and are supported by the elastic support mechanism in a manner so that the pair of gripping portions is movable vertically independent of one another. Thus, even with a configuration in which the guide mechanism is provided as described above, the article is allowed to swing in the travel direction. Thus, the effect from the elastic support mechanism of alleviating vibrations in the direction the article swings in the travel direction is not impeded by the guide mechanism. Also, in the present configuration, a direction orthogonal to the travel direction as seen in a vertical direction aligned with the vertical direction is defined as a width direction; the guide mechanism is configured to guide movement of each one of the pair of the gripping portions in the vertical direction with respect to the connection portion and configured to restrict swinging of each one of the pair of gripping portions with respect to the connection portion. Accordingly, even in a case where a load unbalanced in the width direction acts on the article support portion due to the centroid of the article being offset in the width direction, for example, article support portion tilting in the width direction with respect to the connection portion can be restricted. Thus, the article supported by the article support portion tilting in the width direction with respect to the connection portion can be restricted. The present configuration is suited to cases where the centroid of the article is often offset in the width direction.

Also, preferably, the elastic support mechanism includes a pair of elastic bodies separate from each other in a width direction for each of the pair of gripping portions, the width direction being orthogonal to the travel direction as viewed in the vertical direction; the guide mechanism includes a pair of linear guide mechanisms separate from each other in the width direction for each one of the pair of gripping portions; and in each of the pair of gripping portions, the pair of linear guide mechanisms are disposed further outward in the width direction than the pair of elastic bodies.

According to the present configuration, the load acting on the linear guide mechanisms can be reduced compared to a case where the pair of linear guide mechanisms are further inward in the width direction than the pair of elastic bodies. This makes it easier to avoid increases in the size and cost of the linear guide mechanisms.

Also, preferably, the guide mechanism includes linear guide mechanisms disposed at a plurality of positions, and separate from each other along a horizontal plane; each of the linear guide mechanisms includes: a guide body fixed to a first one of the connection portion and the article support portion, and a movable body fixed to a second one of the connection portion and the article support portion and movable along the guide body; and the guide body is disposed in such a manner that the movable body is movable in the vertical direction.

According to the present configuration, the linear guide mechanisms are disposed at a plurality of sections and are disposed separated in the direction aligned with the horizontal plane. This makes it easier to suppress the load acting on the linear guide mechanisms to a minimum. Also, by the linear guide mechanisms being disposed at a plurality of sections, the article support portion can be easily supported in a stable manner.

Also, preferably, the article is a container including a flange portion at an upper portion and an engagement recess portion at a bottom portion; in response to the article being lowered by the lift device and placed at a placement section, the engagement recess portion engages with an engagement protrusion portion disposed on the placement section for positioning; and the article support portion is configured to grip the flange portion with use of the pair of gripping portions.

According to the present configuration, when the article is placed at the placement section, the engagement recess portion engages with the engagement protrusion portion. This allows the container to be appropriately placed at the appropriate position at the placement section. Also, because the flange portion is gripped by the pair of gripping portions, the article support portion can appropriately hold the article in a suspended state.

INDUSTRIAL APPLICABILITY

The technology according to the present disclosure can be applied to an article transport vehicle that travels along a travel path.

What is claimed is:
1. An article transport vehicle, comprising:
a travel body that travels along a travel path;
a holding device that holds an article; and
a lift device that is on the travel body and that raises and lowers the holding device with respect to the travel body,
wherein the holding device comprises:
a connection portion connected to the lift device;

an article support portion that comes into contact with the article and supports the article;
a grip guide mechanism;
an elastic support mechanism that is between the article support portion and the connection portion and supports the article support portion against the connection portion while being elastic in a vertical direction; and
a vertical guide mechanism that guides the article support portion in the vertical direction with respect to the connection portion, wherein:
the vertical guide mechanism is configured to allow the article support portion to move parallel with the vertical direction with respect to the connection portion and to restrict swinging of the article support portion with respect to the connection portion,
the article support portion comprises a pair of gripping portions arranged in an arrangement direction,
the pair of gripping portions are separate from each other in the arrangement direction and movable toward and away from each other in the arrangement direction,
the vertical guide mechanism comprises a first vertical guide mechanism and a second vertical guide mechanism separate from each other in the arrangement direction in correspondence with the pair of gripping portions,
the grip guide mechanism is supported by the connection portion and configured to guide the pair of gripping portions in the arrangement direction,
the pair of gripping portions comprise a first gripping portion and a second gripping portion,
the elastic support mechanism comprises a first elastic support mechanism corresponding to the first gripping portion and a second elastic support mechanism corresponding to the second gripping portion,
the first gripping portion is supported by the grip guide mechanism via the first vertical guide mechanism and the first elastic support mechanism, and
the second gripping portion is supported by the grip guide mechanism via the second vertical guide mechanism and the second elastic support mechanism.

2. The article transport vehicle according to claim 1, wherein:
the arrangement direction is identical to a travel direction along the travel path,
the elastic support mechanism supports the pair of gripping portions in such a manner that the pair of gripping portions are movable vertically and independently of each other, and
the guide mechanism is configured to guide each of the pair of the gripping portions in the vertical direction with respect to the connection portion.

3. The article transport vehicle according to claim 2, wherein:
the elastic support mechanism comprises a pair of elastic bodies separate from each other in a width direction for each of the pair of gripping portions, the width direction being orthogonal to the travel direction as viewed in the vertical direction,
the vertical guide mechanism comprises a pair of linear vertical guide mechanisms separate from each other in the width direction for each of the pair of gripping portions, and
in each of the pair of gripping portions, the pair of linear vertical guide mechanisms are further outward in the width direction than the pair of elastic bodies.

4. The article transport vehicle according to claim 1, wherein:
The vertical guide mechanism comprises linear vertical guide mechanisms disposed at a plurality of positions and separate from each other along a horizontal plane,
each of the linear vertical guide mechanisms comprises:
a guide body fixed to a first one of the connection portion and the article support portion; and
a movable body fixed to a second one of the connection portion and the article support portion and movable along the guide body; and
wherein the guide body is disposed in such a manner that the movable body is movable in the vertical direction.

5. The article transport vehicle according to claim 1, wherein:
the article is a container including a flange portion at an upper portion and an engagement recess portion at a bottom portion,
in response to the article being lowered by the lift device and placed at a placement section, the engagement recess portion engages with an engagement protrusion portion disposed on the placement section for positioning, and
the article support portion is configured to grip the flange portion with use of the pair of gripping portions.

6. The article transport vehicle according to claim 1, wherein:
the grip guide mechanism is configured to (i) move the first gripping portion, the first vertical guide mechanism, and the first elastic support mechanism integrally with one another in the arrangement direction and (ii) move the second gripping portion, the second vertical guide mechanism, and the second elastic support mechanism integrally with one another in the arrangement direction.

7. The article transport vehicle according to claim 1, wherein:
the vertical guide mechanism is configured to guide each of the pair of gripping portions in the vertical direction with respect to the connection portion,
the first vertical guide mechanism is disposed in a first area in the arrangement direction, the first area overlapping with an area in the arrangement direction in which area a portion of the first gripping portion which portion is below the connection portion is disposed, and
the second vertical guide mechanism is disposed in a second area in the arrangement direction, the second area overlapping with an area in the arrangement direction in which area a portion of the second gripping portion which portion is below the connection portion is disposed.

8. The article transport vehicle according to claim 7, wherein:
the first area further overlaps with an area in the arrangement direction in which area the first elastic support mechanism is disposed, and
the second area further overlaps with an area in the arrangement direction in which area the second elastic support mechanism is disposed.

* * * * *